United States Patent
Ooshima (10) Patent No.: US 7,460,573 B2
(45) Date of Patent: Dec. 2, 2008

(54) OPTICAL FREQUENCY STABILIZER AND METHOD FOR STABILIZING OPTICAL FREQUENCY

(75) Inventor: Shigeru Ooshima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 300 days.

(21) Appl. No.: 11/088,764

(22) Filed: Mar. 25, 2005

(65) Prior Publication Data

US 2005/0220155 A1 Oct. 6, 2005

(30) Foreign Application Priority Data

Mar. 31, 2004 (JP) .............................. 2004-107903
Jan. 26, 2005 (JP) .............................. 2005-018500

(51) Int. Cl.
*H01S 3/13* (2006.01)

(52) U.S. Cl. ...................................................... 372/32

(58) Field of Classification Search .................. 372/20, 372/29.011, 29.02, 32, 33, 38.01, 38.02, 372/92

See application file for complete search history.

(56) References Cited

U.S. PATENT DOCUMENTS

| 4,998,256 | A | | 3/1991 | Ohshima et al. | |
|---|---|---|---|---|---|
| 5,408,566 | A | * | 4/1995 | Eda et al. | 385/131 |
| 5,799,118 | A | | 8/1998 | Ogusu et al. | |
| 6,396,603 | B1 | * | 5/2002 | Kim | 398/91 |
| 6,447,690 | B1 | * | 9/2002 | Ackerman et al. | 216/24 |
| 6,486,999 | B1 | * | 11/2002 | Ackerman et al. | 359/288 |
| 6,501,062 | B2 | * | 12/2002 | Tashiro | 250/208.1 |
| 2003/0058512 | A1 | * | 3/2003 | Jacobowitz et al. | 359/193 |
| 2004/0001258 | A1 | * | 1/2004 | Singh | 359/578 |
| 2004/0131095 | A1 | * | 7/2004 | Ohshima | 372/32 |

FOREIGN PATENT DOCUMENTS

| JP | 2-257686 | 10/1990 |
|---|---|---|
| JP | 2001-324702 | 11/2001 |

OTHER PUBLICATIONS

Mitachi et al "Athermal Glass for the Infrared" Applied Optics 30 (Apr. 1991): 1285-1289.☐☐.*

(Continued)

*Primary Examiner*—Leonardo Andujar
*Assistant Examiner*—Fei Fei Yeung Lopez
(74) *Attorney, Agent, or Firm*—Oblon, Spivak, McClelland, Maier & Neustadt, P.C.

(57) ABSTRACT

An etalon functioning as a Fabry-Perot resonator is formed by bonding a quartz crystal bulk having a pair of Z-cut surfaces and a compensation bulk having a pair of Z-cut surfaces with one of the Z-cut surfaces of the quartz crystal bulk facing one of the Z-cut surfaces of the compensation bulk, reflection films being formed on the other of the Z-cut surfaces of the quartz crystal bulk and the other of the Z-cut surfaces of the compensation bulk, respectively. As for the compensation bulk, a LiCAF having a characteristic that $(1/n)*(\partial n/\partial T)+\alpha$ becomes negative, n being the refractive index, T the temperature and $\alpha$ the linear expansion rate, and a ratio of the optical length of the quartz crystal bulk to that of the compensation bulk being approximately set to $|(1/n)*(\partial n/\partial T)+\alpha|$: $3\times10^{-6}$.

3 Claims, 4 Drawing Sheets

OTHER PUBLICATIONS

Shimamura et al "Growth of LiCaAlF6 Single Crystals with an Extended Diameter and Their Optical Characterizations" Journal of Alloys and Compounds 343 (2002): 204-210.□□.*

Shirasaki, M. "Temperature Insensitive Design of Fabry-Perot Etalon" IEEE Phontonics Technology Letters 11 (1999):1431-1433.*

Ohshima et al "Frequency Control Techniques in Coherent Multichanel LAN's" Journal of Lightwave Technology 13 (1995):1838-1846.*

K. Tatsuno, et al., "50 GHz spacing, multi-wavelength tunable locker integrated in a transmitter module with a monolithic-modulator and a DFB-laser", Technical Digest of OFC, 2001, pp. TuB5-1-Tub5-4.

D. A. Ackerman, et al., "Low-cost, athermal wavelength-locker integrated in a temperature-tuned laser package", Technical Digest of OFC, 2003, pp. PD32-1-PD32-3.

Kiyoshi Shimamura, et al., "Growth of LiCaAlF$_6$ single crystals with an extended diameter and their optical characterizations", Journal of Alloys and Compounds 343, Elsevier Science B.V., 2002, pp. 204-210.

Shigeru Ohshima, et al., "Frequency Control Techniques in Coherent Multichannel LAN's", IEEE, Journal of Lightwave Technology, vol. 13, No. 9, Sep. 1995, pp. 1838-1846.

\* cited by examiner

OPTICAL FREQUENCY STABILIZER AND METHOD FOR STABILIZING OPTICAL FREQUENCY

CROSS-REFERENCE TO RELATED APPLICATIONS

This application is based upon and claims the benefit of priority from prior Japanese Patent Applications No. 2004-107903, filed Mar. 31, 2004; and No. 2005-018500, filed Jan. 26, 2005, the entire contents of both of which are incorporated herein by reference.

BACKGROUND OF THE INVENTION

1. Field of the Invention

The present invention relates to an optical frequency stabilizer and a method for stabilizing an optical frequency applicable to wavelength division multiplexing (WDM) transmission.

2. Description of the Related Art

As generally known, a laser diode (LD) used for WDM transmission system outputs a forward laser beam and a backward laser beam. The forward laser beam output from the laser diode is input to an optical fiber which is connected to transmission path. The backward laser beam output from the laser diode is input to a conventional optical frequency stabilizer.

The stabilizer comprises a Fabry-Perot resonator formed by an etalon. In the stabilizer, the laser beam is input to the etalon. The laser beam transmitted through the etalon is converted to an electrical signal. The electrical signal is compared with a reference value, obtaining an error signal. The error signal controls the oscillation wavelength of the laser diode.

According to such a configuration, the optical frequency of the laser beam generated from the laser diode can be stabilized to a specified value of optical transmittance of the etalon. With regard to this technology, details appear in following document 1.

Document 1

K. Tatsuno et al., "50-GHz spacing, multi-wavelength tunable locker integrated in a transmitter module with a monolithic-modulator and a DFB-laser", in Technical Digest OFC (Optical Fiber Communication Conference and Exhibit) 2001, USA, TuB5.

The etalon can be made of quartz glass, quartz crystal or the like. A quartz crystal etalon is hardly influenced by external temperature in comparison with an ordinary etalon, because the temperature coefficient of the quartz crystal etalon is as small as 500 MHz/deg. Even if the stabilizer has a quartz crystal etalon, the optical frequency varies by several 100 MHz when the external temperature varies by 40 deg. The temperature influence described above is a considerable problem to the laser diode used for the WDM transmission system, because the system requires optical frequency in the order of one GHz.

BRIEF SUMMARY OF THE INVENTION

An object of the present invention is to provide an optical frequency stabilizer and a method for stabilizing an optical frequency which can easily improve the temperature coefficient of an etalon, and thereby greatly improve optical frequency accuracy, enhance a multiple density even when used for WDM transmission to achieve increase of transmission capacity, maintain reliability of optical transmission, and greatly simplify heat design of an optical module equipped with the etalon.

According to a first aspect of the present invention, there is provided an optical frequency stabilizer to stabilize an optical frequency of a laser beam emitted from a laser diode comprises: an etalon formed by bonding a quartz crystal bulk having a pair of Z-cut surfaces and a LiCAF bulk having a pair of Z-cut surfaces with one of the Z-cut surfaces of the quartz crystal bulk facing one of the Z-cut surfaces of the LiCAF, reflection films being formed on the other of the Z-cut surfaces of the quartz crystal bulk and the other of the Z-cut surfaces of the LiCAF, respectively, and a ratio of an optical length of the quartz crystal bulk to that of the LiCAF bulk being set between 2:3 and 1:7, wherein the etalon function as a Fabry-Perot resonator; a photo-detector to receive the laser beam transmitted though the etalon and convert the laser beam into an electrical signal; and an error signal generator to generate an error signal from the electrical signal output from the photo-detector; the error signal used for controlling the optical frequency of the laser diode.

According to a second aspect of the present invention, there is provided an optical frequency stabilizer to stabilize an optical frequency of a laser beam emitted from a laser diode comprises: an etalon formed by bonding a quartz crystal bulk having a pair of Z-cut surfaces and a compensation bulk having a pair of Z-cut surfaces with one of the Z-cut surfaces of the quartz crystal bulk facing one of the Z-cut surfaces of the compensation bulk, reflection films being formed on the other of the Z-cut surfaces of the quartz crystal bulk and the other of the Z-cut surfaces of the compensation bulk, respectively, and the compensation bulk having a characteristic that $(1n)*(\partial n/\partial T)+\alpha$ becomes negative, n being the refractive index, T the temperature and $\alpha$ the linear expansion rate, and a ratio of the optical length of the quartz crystal bulk to that of the compensation bulk being approximately set to $|(1n)*(\partial n/\partial T)+\alpha|:3\times10^{-6}$, wherein the etalon function as a Fabry-Perot resonator; a photo-detector to receive the laser beam transmitted though the etalon and convert the laser beam into an electrical signal; and an error signal generator to generate an error signal from the electrical signal output from the photo-detector, the error signal used for controlling the optical frequency of the laser diode.

According to a third aspect of the present invention, there is provided a method for stabilizing an optical frequency of a laser beam emitted from a laser diode comprises preparing an etalon formed by bonding a quartz crystal bulk having a pair of Z-cut surfaces and a LiCAF bulk having a pair of Z-cut surfaces with one of the Z-cut surfaces of the quartz crystal bulk facing one of the Z-cut surfaces of the LiCAF, reflection films being formed on the other of the Z-cut surfaces of the quartz crystal bulk and the other of the Z-cut surfaces of the LiCAF, respectively, and a ratio of an optical length of the quartz crystal bulk to that of the LiCAF bulk being set between 2:3 and 1:7, wherein the etalon function as a Fabry-Perot resonator; receiving the laser beam transmitted though the etalon and converting the laser beam into an electrical signal; and generating an error signal from the electrical signal, the error signal used for controlling the optical frequency of the laser diode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, modes of the present invention will be explained precisely by referring drawings.

First Embodiment

Figure 1:
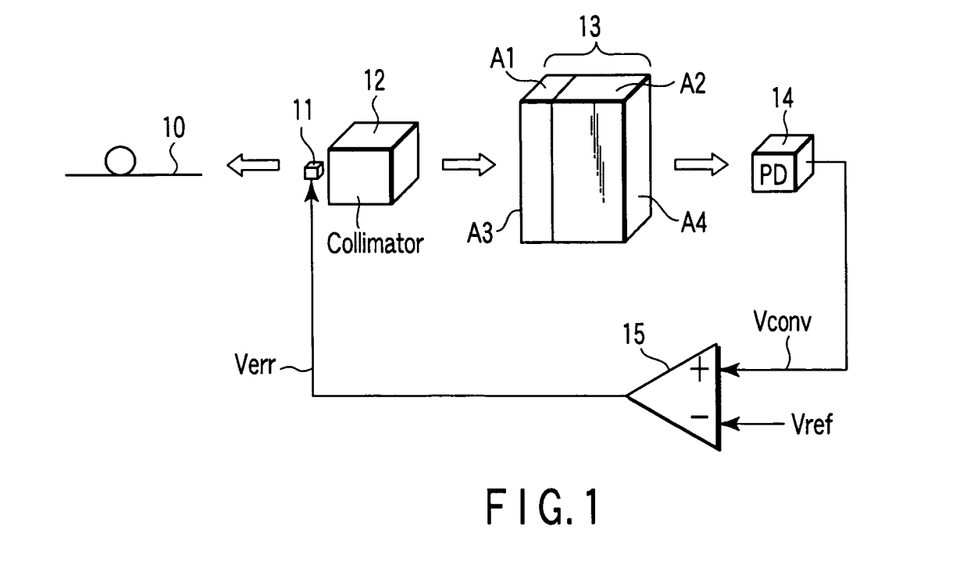
FIG. 1 is a perspective view showing a configuration of a first embodiment of an optical frequency stabilizer regarding the present invention.

FIG. 1 is a perspective view showing a configuration of a first embodiment of an optical frequency stabilizer regarding the present invention. In FIG. 1, a laser beam output forward from a laser diode (LD) 11 is guided to an incident end of an optical fiber 10 connected to an optical transmission path and emitted to a transmission path. A laser beam output from backward with the same frequency is converted into a parallel beam by a collimator 12, transmitted through an etalon 13 to be input into a photo-detector 14 and converted into an electrical signal.

The etalon 13 is formed by bonding a quartz crystal bulk A1 with a compensation bulk A2. An optical reflection film A3 is formed on one Z-cut surface of the bulk A1, and an optical reflection film A4 is also formed on a surface opposed to a surface on which the film A3 is formed. These two films A3, A4 are formed of, for example, dielectric multilayer thin films, respectively, and the etalon 13 functioning as a Fabry-Perot resonator is formed by making the faces on which the films A3, A4 are formed, respectively, parallel to each other.

The detector 14 receives a transmitted beam through the etalon 13 and converts it into the electrical signal, the converted electrical signal Vconv is input to an amplifier 15, the difference between a reference value Vref and converted value Vconv is amplified and an error signal Verr is obtained. The error signal Verr is provided to control a wavelength of the laser diode 11. Thereby, the optical frequency of the signal beam generated from the laser diode 11 is stabilized to a specified value of optical transmittance of the etalon 13. The stability of the optical frequency is improved by setting the reference value to a value proportional to the output beam from the laser diode 11 as described in the document 1.

In such a configuration described above, a principle of temperature compensation for the etalon 13 will be explained.

The refractive index, length and linear expansion of a quartz crystal when the temperature T is zero are set to $n_{q0}$, $L_{q0}$ and $\alpha_q$, respectively. Similarly, the refractive index, length and linear expansion of a compensation member are set to $n_{c0}$, $L_{c0}$ and $\alpha_c$, respectively. If the whole of an optical length is set to L, the length L is expressed as formula (1).

$$L = [n_{q0} + (\partial n_{q0}/\partial T) \cdot T]L_{q0}(1 + \alpha_q T) + \quad (1)$$
$$[n_{c0} + (\partial n_{c0}/\partial T) \cdot T]L_{c0}(1 + \alpha_c T)$$
$$\approx n_{q0}L_{q0} + n_{c0}L_{c0} +$$
$$T\left[\left(\frac{\partial n_{q0}/\partial T}{n_{q0}} + \alpha_q\right)n_{q0}L_{q0} + \left(\frac{\partial n_{c0}/\partial T}{n_{c0}} + \alpha_c\right)n_{c0}L_{c0}\right]$$

It is necessary for formula (2) to come into effect in order to make the length L independent of the temperature T.

$$\left(\frac{\partial n_{q0}/\partial T}{n_{q0}} + \alpha_q\right)n_{q0}L_{q0} + \left(\frac{\partial n_{c0}/\partial T}{n_{c0}} + \alpha_c\right)n_{c0}L_{c0} = 0 \quad (2)$$

Accordingly, the ratio $n_{q0}L_{q0}:N_{c0}L_{c0}$ of optical lengths of the bulk A1 and the bulk A2 is set to $(1/nc0)*(\partial nc0/\partial T)+\alpha c$: $(1/q0)*(\partial nq0/\partial T) +\alpha q$.

In a Z-cut quartz crystal within a 1.5 μm wavelength band, $n_{q0}=1.53$, $\partial n_{q0}/\partial T=-7\times10^{-6}$, $\alpha_q=8\times10^{-6}$ are satisfied, and the value of $(1/n_{q0})*(\partial n_{q0}/\partial T)+\alpha_q$ becomes about $3\times10^{-6}$. Accordingly, The ratio of the optical length of the bulk A1 to the optical length of the bulk A2 is set to $|(1/n)*(\partial n/\partial T)+\alpha|$: $3\times10^{-6}$.

On the other hand, it can be confirmed that a Z-cut plate made of $LiCaAlF_6$ (LiCAF) has the most excellent compensation characteristic as a material for the bulk A2 at the present time. If it is assumed that this material should be used, $n_{c0}=1.38$, $\partial n_{q0}/\partial T=-6\times10^{-6}$, $\alpha_q=2.5\times10^{-6}$ are satisfied, and the value of $(1/n_{c0})*(\partial n_{c0}/\partial T)+\alpha_c$ becomes $-2\times10^6$. Accordingly, the ratio of the optical length of the quartz crystal to the optical length of the LiCAF is set approximately to 2:3.

But, the linear expansion ratio in X,Y axes directions of the LiCAF is $23\times10^{-6}$, and larger than that of the quartz crystal $12\times10^{-6}$. Therefore, stress is caused by a variation in a temperature in the etalon 13 in which the LiCAF and the quartz crystal are bonded with each other. If such a stress is caused, the refractive index is varied due to the photo-elastic effect. As a result, in fact, the ratio of the optical lengths between the quartz crystal and the LiCAF deviates from 2:3.

Figure 7:
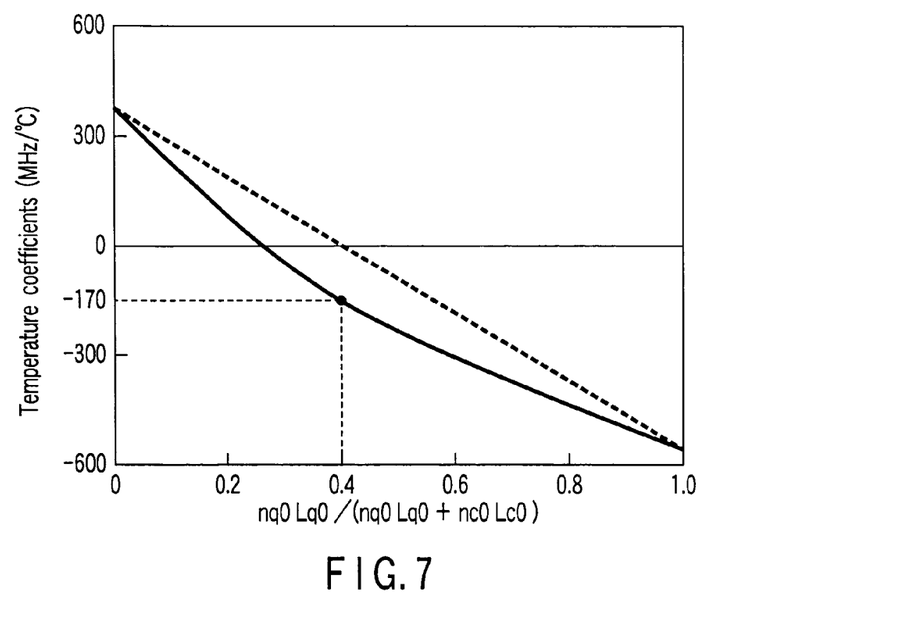
FIG. 7 is a characteristic graph showing a relationship between an optical length ratio of a quartz crystal to a LiCAF and a temperature coefficient of the stabilizer regarding the present invention.

Then, the etalon 13 having the ratio of the optical lengths of 2:3 between the quartz crystal and the LiCAF is produced by way of trial, and the product is evaluated. As a result, a temperature coefficient of −170 MHz/°C. at the wavelength band of 1.55 μm is obtained. A state in which the actually measured values are plotted in a graph with the lateral axis as $n_{q0}L_{q0}/(n_{q0}+n_{c0}L_{c0})$ (corresponding to the ratio of the optical lengths between the quartz crystal and the LiCAF) and the longitudinal axis as the temperature coefficient is shown in FIG. 7. In FIG. 7, the position at which the lateral axis indicates value "0" represents that the etalon is made of the LiCAF only, and the position of "1.0" represents that the etalon is made of the quartz crystal only. A linear line shown by a dot line in FIG. 7 represents theoretical values of temperature coefficients obtained by calculations of the formula (1). The actually measured values when the ratio between the quartz crystal and the LiCAF is 2:3 deviates from theoretical values, however, at the positions of "0" and "1.0" of the lateral axis, the theoretical temperature coefficients of course coincide with the actually measure values. Consequently, a relationship between the ratio of the optical lengths between the quartz crystal and the LiCAF and the temperature coefficient is estimated to have a characteristic of a curved line actually represented in a full line.

Figure 8:
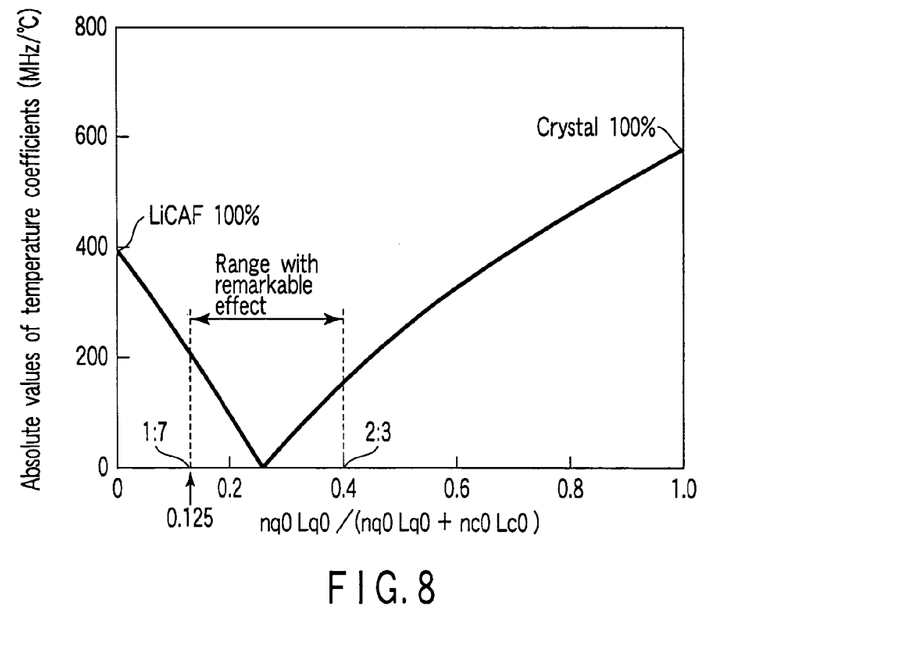
FIG. 8 is a characteristic graph showing characteristics of actually measured values shown by a full line by replacing it with characteristics of absolute values of the temperature coefficient.

In a laser diode, stability of an optical frequency depended upon an absolute value of a temperature coefficient. Then, if the absolute values of the characteristic shown in FIG. 7 are plotted, the absolute values are expressed in the graph shown in FIG. 8. Here, it is decided that it is enough for an effect of an improvement of the stability to become about double the absolute values of the etalon 13 composed by only the LiCAF. In this case, the range to achieve about double the absolute values of the etalon 13 is equivalent to the range in which a half of the temperature coefficient of the etalon 13 composed by only the LiCAF is given. The range to be taken by the absolute values of the temperature coefficient $n_{q0}L_{q0}/(n_{q0}+n_{c0}L_{c0})$ is 0.125 to 0.4. This range means that the ratio of the optical length of the quartz crystal to that of the LiCAF is between 1:7 and 2:3, and it is possible for this range to improve the stability up to about double the conventional optical length.

As for an example, an etalon with a free spectrum range (FSR) of 100 GHz will be designed. There is a relationship expressed in formula (3) between the FSR and the optical length L of the etalon 13.

$$FSR = \frac{c}{2L} \quad (3)$$

Where, c is the optical velocity in vacuum. It is clear from formula (3) that the optical length L of the etalon 13 with FSR=100 GHz to be set to 1.5 mm. Accordingly, the optical lengths of the quartz crystal and the LiCAF are respectively set between a combination of 0.6 mm and 0.9 mm and a combination of 0.188 mm and 1.31 mm.

Actual thicknesses can be obtained by dividing the optical lengths by each reflection factor, respectively. Accordingly, thicknesses of the quartz crystal and the LICAF are set between a combination of 0.39 mm and 0.65 mm and a combination of 0.12 mm and 0.95 mm, respectively. With the setting to such a ratio of the thicknesses, the etalon 13 is not affected by temperature, and stability of an optical frequency can be improved.

An adhesive is generally used to bond the quartz crystal bulk A1 with the compensation bulk A2. Refractive indices of the quartz crystal for ordinary wave, the compensation bulk and the adhesive are assumed to be $n_0$, $n_L$ and n, respectively. When $n_0 > n_L$, if an adhesive with the refractive index n between $n_0$ and $n_L$ is used, since reflection at an interface is reduced, an etalon with a periodic transmission characteristic can be obtained.

Especially, if the refractive index n has such a value of $n=(n^0 n_L)^{1/2}$ and a thickness of an adhesion layer becomes $\lambda_k/(4n)$ (k=1, 3, 5, etc.), since an optical reflection generated on two interfaces of the adhesive are cancelled each other, a transmission characteristic having an extremely periodical cycle can be obtained. The same goes in case of the relationship $n_0 < n_L$, and n may set to satisfy the relationship $n_0 < n < n_L$.

The following document 2 and 3 describe temperature coefficients of the LiCAF which has recognized to exhibit a large effect as the compensation bulk above described, however they do not describe about how to set a temperature coefficient of a refractive index $\partial n_{q0}/\partial T$ and a quartz crystal axis.

Document 2

D. A. Ackerman et al., "Low-cost, a thermal wavelength-locker integrated in a temperature-tuned laser package", in Technical Digest OFC (Optical Fiber Communication Conference and Exhibit) 2003, USA, PD32

Document 3

K. Shimamura et al., "Growth pf LiCaAlF6 single crystals with an extended diameter and their optical characterizations", Journal of Alloys and Compounds 343 (2002), pp. 204-210

Second Embodiment

Figure 2:
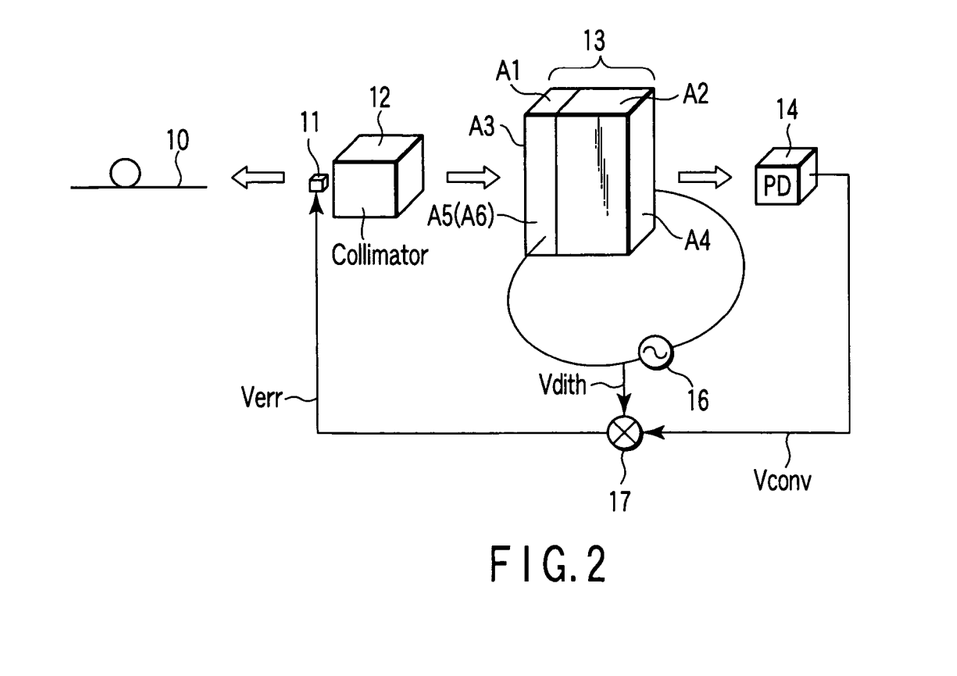
FIG. 2 is a perspective view showing a second embodiment of the stabilizer regarding the present invention.

FIG. 2 is a perspective view showing a configuration of a second embodiment of an optical frequency stabilizer regarding the present invention. In FIG. 2, the same parts as those of FIG. 1 are designated with the same reference symbols, and overlapping explanation will be neglected.

In the stabilizer shown in FIG. 2, electrodes A5, A6 (A6 is not shown) are formed on a pair of mutually opposed X-cut surfaces of a quartz crystal bulk A1, and a dither signal Vdith generated from an oscillator 16 is supplied between the electrodes A5, A6. Thereby the etalon 13 performs modulation caused by the dither signal Vdith to the transmitted beam for a Fabry-Perot resonance action. The electrodes A5, A6 are preferably metallic electrodes suitable for wire bonding or soldering and chemically stable.

On the other hand, an electrical signal Vconv output from a photo-detector 14 by receiving the transmitted beam through the etalon 13 is input to a synchronous detector 17 together with the dither signal generated from the oscillator 16. The synchronous detector 17 generates an error signal Verr of the electrical signal Vconv against the dither signal Vdith.

The error signal Verr generated by the processing above described is supplied for optical frequency control of the laser diode 11. As a result, an optical frequency of the laser beam emitted from the laser diode 11 is stabilized to an extreme value of the optical transmittance of the etalon 13.

Processing operations of the second embodiment will be explained by referring FIG. 3 in more detail.

Figure 3:
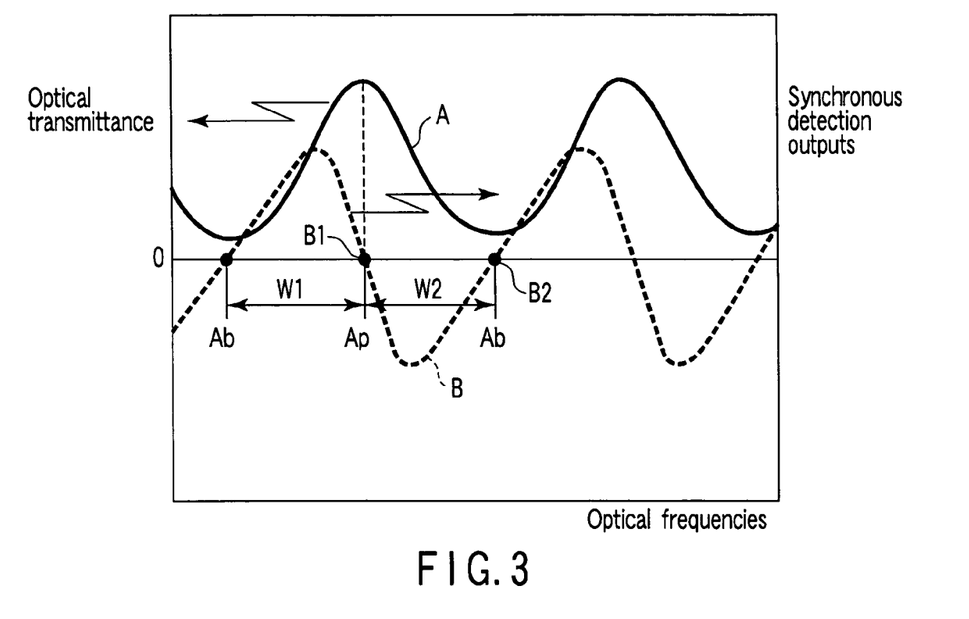
FIG. 3 is a waveform graph for explaining a third embodiment of the stabilizer of the present invention.

In FIG. 3, A indicates an optical transmittance of the etalon 13. If the dither signal Vdith is supplied to the electrodes A5, A6 of the X-cut faces of the bulk A1, the bulk A1 performs movements of expansion/contraction resulting from piezoelectric effect. Accordingly, optical transmission characteristics of the etalon 13 are also move laterally with a small amount due to the dither signal Vdith. As a result, transmitted beam strength of the etalon 13 is also varied.

By the way, in the optical transmittance A, an optical frequency range W1 from a minimum value Ab to a maximum value Ap and an optical frequency range W2 from the maximum value Ap to the minimum value Vb are different in tilt symbol of the optical transmittance. Therefore, phases of the transmitted beam strength modulated by the etalon 13 are different in the range W1, W2 by 180 degree.

Then, a signal with a waveform B is obtained by synchronously detecting with the signal Vconv which is a signal photo-electrically converted the transmitted beam through the etalon 13 and with the dither signal Vdith. By using this signal for the optical frequency control of the laser 11 as the error signal Verr, the laser frequency can be stabilized to a first or a second optical frequency BI or B2 being a zero-cross point of the waveform B.

The first or the second optical frequency B1 or B2 is the maximum value Ap and the minimum value Ab of the optical transmittance of the etalon 13, respectively. Consequently, the optical frequency of the laser beam can be selectively stabilized to the optical frequencies B1, B2 to give the maximum Ap and the minimum Ab of the optical transmittance of the etalon 13 by changing a polarity of feedback control.

The above-described method for stabilizing an optical frequency using the dither signal is not affected by a DC drift of an amplifier or a variation in a dark current of a photo-detector, so that the optical frequency can be stabilized with high accuracy.

Third Embodiment

Figure 4:
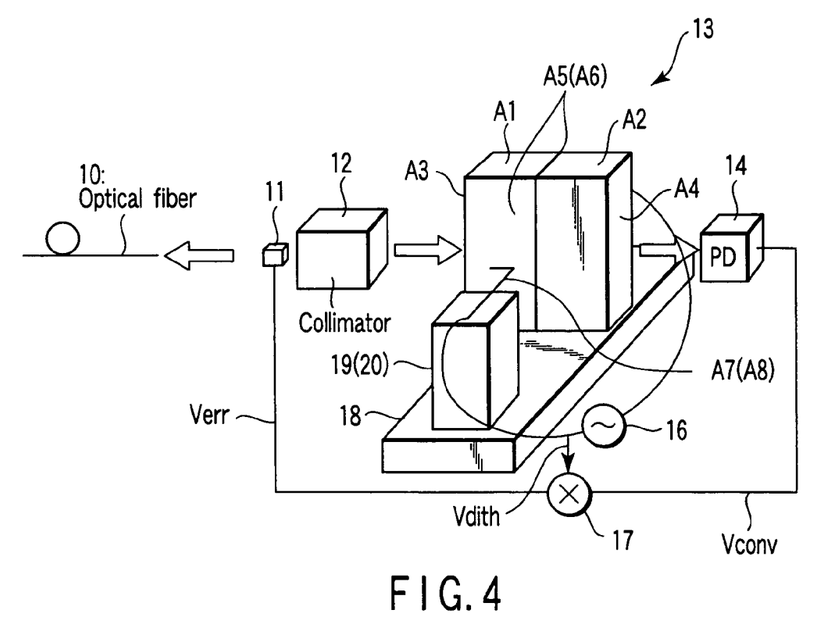
FIG. 4 is a perspective view showing a configuration of a third embodiment of the stabilizer regarding the present invention.

FIG. 4 is a perspective view showing a configuration of a third embodiment of an optical frequency stabilizer regarding the present invention.

In FIG. 4, the same parts as those of FIG. 1, 2 are designated with the same reference symbols, and overlapping explanation will be neglected.

It is not shown in FIG. 2 that how an etalon 13 is disposed, but an adhesive may be applied at a lower part of the etalon 13 and the etalon 13 may be fixed on a bottom surface of a base so as to be easily disposed. However, since the adhesive generally has a large mechanical loss, oscillations of a quartz crystal bulk A1 caused by a dither signal Vdith does not increase. A central part of the etalon 13 should be supported so as to increase the oscillations of the bulk A1 and an optical modulation factor by the etalon 13.

Thus, in the third embodiment shown in FIG. 4, a pair of support posts 19, 20 (a support post 20 is not shown in FIG. 4) are disposed on a base 18 with the etalon 13 arranged thereon, electric conductive shafts A7, A8 (shaft A8 is not shown in FIG. 4) are joined at central parts of a pair of surfaces with electrode layers respectively formed thereon, and the etalon 13 is brought into a state of suspension by fixing the shafts A7, A8 to the support posts 19, 20, respectively.

According to the configuration above described, the etalon 13 is made non-contact to the base 18. In a resonance mode of the lowest mechanical oscillation frequency in such a non-contact state, central parts of the etalon 13 serves as nodes and both end parts serve as free edges. Accordingly, since the shafts A7, A8 are connected to the nodes, mechanical losses caused by the shafts A7, A8 are small and Q of resonance is remarkably increased.

By the way, if a modulation factor of the transmitted beam through the etalon 13 is analytically obtained, an optical modulation factor becomes maximal at the parts of nodes, i.e., the central parts, and become zero at end parts. Therefore, an S/N of a signal obtained from a photo-detector 14 is drastically improved by transmitting a light beam through the central parts at which the modulation factors become maximal, thereby the optical frequency accuracy can be extremely improved.

According to this configuration, it is possible to adjust a shifting angle by applying a force to an upper part or a lower part of the etalon 13 and shift optical frequency characteristics thereof. For example, emits the laser beam, applies the dither signal Vdith, connects an output from a synchronous detector 17 to a voltage meter and connects an output from an optical fiber 10 to adjust an angle so that a synchronous detection output becomes zero at an optical frequency to be set. With addition of this adjustment process, a final adjustment of the optical frequency becomes extremely high in operability and accuracy of setting of the optical frequency can be remarkably improved.

Fourth Embodiment

Figure 5:
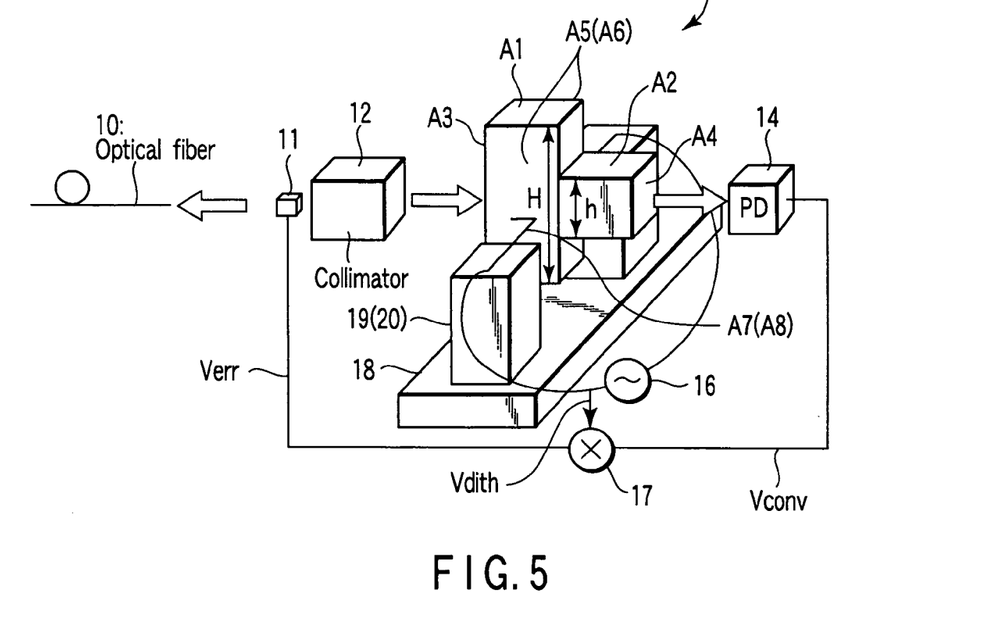
FIG. 5 is a perspective view showing a fourth embodiment of the stabilizer regarding the present invention.

FIG. 5 is a perspective view showing a configuration of a fourth embodiment of an optical frequency stabilizer regarding the present invention. In FIG. 5, the same parts as those of in FIGS. 1, 2 and 4 are designated with the same reference symbols, and overlapping explanation will be neglected.

The fourth embodiment shown in FIG. 5 is characterized in that only a central part through which a light beam transmits is connected to a compensation bulk A2 so as to further increase an oscillation of a quartz crystal bulk A1 and an optical modulation factor generated by an etalon 13. In FIG. 5, the bulk A2 is shorter than the bulk A1 and is bonded with only the central part through which the light beam transmits.

A quartz crystal is a material having an extremely small mechanical loss and a mechanical loss of a compensation member is generally larger than that of the quartz crystal. Especially, in the case of bonding the bulk A1 with the bulk A2 by using an adhesive, since a mechanical loss of the adhesive is extremely large, the mechanical loss of the bulk A2 is increased by not less than several times of the bulk A1. In this case, the smaller the size of the bulk A2, the smaller mechanical loss of the bulk A1 is obtained. Thereby, in the etalon 13, the oscillation of the bulk A1 is increased and the modulation factor is also increased.

Figure 6:
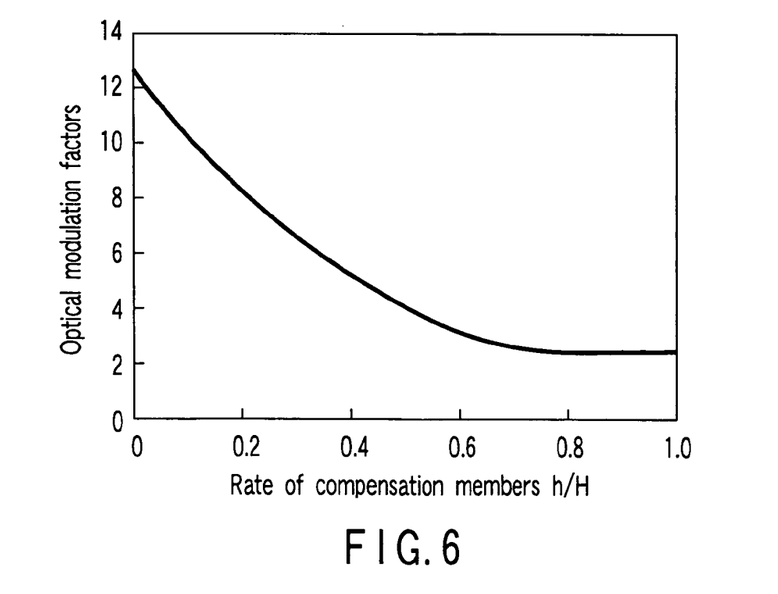
FIG. 6 is a waveform graph for explaining an effect of the fourth embodiment shown in FIG. 5.

A height of the bulk A1 is set to H, a height of the bulk A2 is set to h, and a relation between a rate h/H of the bulk A2 and the optical modulation factor is researched, then as a result, characteristics shown in FIG. 6 is obtained. It is possible for the modulation factor to be increased twice or more by bringing the rate h/H into 40% or under according to the characteristics shown in FIG. 6, and it becomes clear that the smaller the size of the compensation member, the larger of the modulation factor is obtained.

If linear expansion of the bulk A1 and the bulk A2 are approximately equal and forces among molecules are acted, both bulk A1, A2 can be bonded by a heat-bonding technique. The heat-bonding technique is a technique to press two members and bond in a high temperature state, and the technique can bond the members via no adhesive and achieve high reliability.

With use of such a heat-bonding technique, since the technique does not use the adhesive, a mechanical loss of the etalon 13 can be extremely reduced and the modulation factor can be further increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical frequency stabilizer to stabilize an optical frequency of a laser beam emitted from a laser diode comprising:

an etalon formed by bonding a quartz crystal bulk having a pair of Z-cut surfaces and a LiCAF bulk having a pair of Z-cut surfaces with one of the Z-cut surfaces of the quartz crystal bulk facing one of the Z-cut surfaces of the LiCAF, reflection films being formed on the other of the Z-cut surfaces of the quartz crystal bulk and the other of the Z-cut surfaces of the LiCAF, respectively, and a ratio of an optical length of the quartz crystal bulk to that of the LiCAF bulk being set between 2:3 and 1:7, wherein the etalon functions as a Fabry-Perot resonator;

a photo-detector to receive the laser beam transmitted through the etalon and convert the laser beam into an electrical signal;

an error signal generator to generate an error signal from the electrical signal output from the photo-detector, the error signal used for controlling the optical frequency of the laser diode;

an oscillator to generate a dither signal;

the quartz crystal bulk including electrodes formed on a pair of X-cut surfaces, respectively, and supplied with the dither signal there between;

the error signal generator including a synchronous detector to detect synchronously the electrical signal output from the photo-detector, based on the dither signal to obtain the error signal, and the error signal used for controlling the optical frequency of the laser diode to stabilize the optical frequency to an extreme value of an optical transmittance of the etalon; and a base comprising
  a pair of shafts having first ends respectively attached to central parts of surfaces of electrodes formed on the pair of X-cut surfaces of the Quartz crystal bulk, and
  a holding device configured to hold second ends of the pair of shafts, separate a bottom part of the etalon from the base and transmit the laser beam near by a central part of the etalon, wherein the LiCAF bulk is lower in height than the quartz crystal bulk.

2. An optical frequency stabilizer to stabilize an optical frequency of a laser beam emitted from a laser diode comprising:

an etalon formed by bonding a quartz crystal bulk having a pair of Z-cut surfaces and a compensation bulk having a pair of Z-cut surfaces with one of the Z-cut surfaces of the quartz crystal bulk facing one of the Z-cut surfaces of the compensation bulk, reflection films being formed on the other of the Z-cut surfaces of the quartz crystal bulk and the other of the Z-cut surfaces of the compensation bulk, respectively, and the compensation bulk having a characteristic that $(1/n)*(\partial n/\partial T)+\alpha$ becomes negative, n being the refractive index, T the temperature and $\alpha$ the linear expansion rate, and a ratio of the optical length of the quartz crystal bulk to that of the compensation bulk being approximately set to $|(1/n)*(\partial n/\partial T)+\alpha|:3 \times 10^{-6}$, wherein the etalon functions as a Fabry-Perot resonator;

a photo-detector to receive the laser beam transmitted through the etalon and convert the laser beam into an electrical signal;

an error signal generator to generate an error signal from the electrical signal output from the photo-detector, the error signal used for controlling the optical frequency of the laser diode;

an oscillator to generate a dither signal;

the quartz crystal bulk including electrodes formed on a pair of X-cut surfaces, respectively, and supplied with the dither signal there between;

the error signal generator including a synchronous detector to detect synchronously the electrical signal output from the photo-detector, based on the dither signal to obtain the error signal, and the error signal used for controlling the optical frequency of the laser diode to stabilize the optical frequency to an extreme value of an optical transmittance of the etalon; and a base comprising
  pair of shafts having first ends respectively attached to central parts of surfaces of electrodes formed on the pair of X-cut surfaces of the quartz crystal bulk, and
  a holding device configured to hold second ends of the pair of shafts, separate a bottom part of the etalon from the base and transmit the laser beam near by a central part of the etalon, wherein the compensation bulk is lower in height than the quartz crystal bulk.

3. A method for stabilizing an optical frequency of a laser beam emitted from a laser diode comprising:

preparing an etalon formed by bonding a quartz crystal bulk having a pair of Z-cut surfaces and a LiCAF bulk having a pair of Z-cut surfaces with one of the Z-cut surfaces of the quartz crystal bulk facing one of the Z-cut surfaces of the LiCAF, reflection films being formed on the other of the Z-cut surfaces of the quartz crystal bulk and the other of the Z-cut surfaces of the LiCAF, respectively, and a ratio of an optical length of the quartz crystal bulk to that of the LiCAF bulk being set between 2:3 and 1:7, wherein the etalon functions as a Fabry-Perot resonator;

receiving the laser beam transmitted though the etalon and converting the laser beam into an electrical signal;

generating an error signal from the electrical signal, the error signal used for controlling the optical frequency of the laser diode;

generating a dither signal;

supplying the dither signal to electrodes formed on a pair of X-cut surfaces of the quartz crystal bulk, respectively;

detecting synchronously the electrical signal, based on the dither signal to obtain the error signal, and the error signal used for controlling the optical frequency of the laser diode and to stabilize the optical frequency to an extreme value of an optical transmittance of the etalon;

separating a bottom part of the etalon from a base; and transmitting the laser beam near by a central part of the etalon, wherein the LiCAF bulk is lower in height than the quartz crystal bulk.

* * * * *